(12) United States Patent
Weinmann et al.

(10) Patent No.: US 11,509,254 B2
(45) Date of Patent: Nov. 22, 2022

(54) METHOD FOR DETECTING A MOTOR PHASE FAULT OF A MOTOR ARRANGEMENT AND DRIVE CIRCUIT FOR DRIVING AN ELECTRONICALLY COMMUTATED MOTOR

(71) Applicant: DIEHL AKO STIFTUNG & CO. KG, Wangen (DE)

(72) Inventors: Martin Weinmann, Bad Waldsee (DE); Andreas Schmid, Wangen im Allgaeu (DE); Sebastian Tinius, Lauf (DE)

(73) Assignee: Diehl AKO Stiftung & Co. KG, Wangen (DE)

(*) Notice: Subject to any disclaimer, the term of this patent is extended or adjusted under 35 U.S.C. 154(b) by 159 days.

(21) Appl. No.: 16/537,808

(22) Filed: Aug. 12, 2019

(65) Prior Publication Data
US 2020/0052641 A1    Feb. 13, 2020

(30) Foreign Application Priority Data
Aug. 11, 2018  (DE) ..................... 10 2018 006 355.1

(51) Int. Cl.
| G05F 1/70 | (2006.01) |
| H02P 23/00 | (2016.01) |
| H02P 25/00 | (2006.01) |
| H02P 29/024 | (2016.01) |
| H02P 23/26 | (2016.01) |
| H02P 27/06 | (2006.01) |

(52) U.S. Cl.
CPC .......... *H02P 29/0243* (2016.02); *H02P 23/26* (2016.02); *H02P 27/06* (2013.01); *H02P 2201/15* (2013.01)

(58) Field of Classification Search
CPC ....... H02P 29/0243; H02P 23/26; H02P 27/06
USPC ......................................................... 318/438
See application file for complete search history.

(56) References Cited

U.S. PATENT DOCUMENTS

| 3,656,136 A | 4/1972 | Blair |
| 5,243,243 A | 9/1993 | Andrews |
| 5,751,132 A | 5/1998 | Horvath et al. |
| 5,945,802 A | 8/1999 | Konrad et al. |
| 6,043,664 A | 3/2000 | Kliman et al. |
| 7,834,573 B2 * | 11/2010 | Lindsey ............... H02H 7/0855 318/490 |
| 10,541,539 B1 * | 1/2020 | Miyake ............... H02M 1/4225 |

(Continued)

FOREIGN PATENT DOCUMENTS

| DE | 69831272 T2 | 7/2006 |
| DE | 69833097 T2 | 8/2006 |

(Continued)

*Primary Examiner* — Erick D Glass
(74) *Attorney, Agent, or Firm* — Laurence A. Greenberg; Werner H. Stemer; Ralph E. Locher

(57) ABSTRACT

In a method for detecting a motor phase fault of a motor arrangement, the motor phases of which are connected to a drive circuit having a DC voltage intermediate circuit and an inverter. A motor phase voltage at at least one of the motor phases with respect to a reference potential is captured while the inverter is switched off; and a voltage profile of the captured motor phase voltage is used to determine whether there is a motor phase fault on one of the motor phases of the motor arrangement.

10 Claims, 13 Drawing Sheets

(56) References Cited

U.S. PATENT DOCUMENTS

| | | | |
|---|---|---|---|
| 2010/0039836 A1* | 2/2010 | Gong | H02M 3/156 363/21.13 |
| 2015/0130379 A1* | 5/2015 | Ando | H02P 6/12 318/400.21 |
| 2015/0293165 A1 | 10/2015 | Tateda et al. | |
| 2016/0245847 A1* | 8/2016 | Haas | G01R 31/50 |
| 2016/0315461 A1 | 10/2016 | Pieler et al. | |
| 2016/0336732 A1 | 11/2016 | Hackl et al. | |
| 2017/0131340 A1* | 5/2017 | Tallam | H02M 5/458 |
| 2017/0302214 A1* | 10/2017 | Marcinkiewicz | H02M 1/4225 |
| 2020/0044457 A1* | 2/2020 | Miyake | H02M 1/4225 |

FOREIGN PATENT DOCUMENTS

| | | |
|---|---|---|
| DE | 102015105260 A1 | 10/2015 |
| DE | 102015207456 B3 | 9/2016 |
| DE | 102015208725 B3 | 9/2016 |

\* cited by examiner

METHOD FOR DETECTING A MOTOR PHASE FAULT OF A MOTOR ARRANGEMENT AND DRIVE CIRCUIT FOR DRIVING AN ELECTRONICALLY COMMUTATED MOTOR

CROSS-REFERENCE TO RELATED APPLICATION

This application claims the priority, under 35 U.S.C. § 119, of German application DE 10 2018 006 355.1, filed Aug. 11, 2018; the prior application is herewith incorporated by reference in its entirety.

BACKGROUND OF THE INVENTION

Field of the Invention

The present invention relates to a method for detecting a motor phase fault of a motor arrangement, to a method for operating a drive circuit for driving an electronically commutated motor having such motor phase detection, and to a drive circuit for driving an electronically commutated motor.

When operating an electronically commutated motor using a drive circuit, various insulation faults may arise on the side of the motor. These insulation faults include insulation faults of the motor phases which may arise, for example, as a result of a defect in the motor cable or the motor winding. In addition, an insulation fault may arise at a motor neutral point as a result of insulation faults of the motor windings. In the case of an insulation fault, an electrical current can flow away to earth or the protective conductor, in which case such a fault current may constitute a risk to persons as a result of electrical shock and a fire risk. Furthermore, interruptions in motor phases may arise in motor arrangements, for example as a result of severed motor cables or burnt-out motor windings. There is a general attempt to reliably detect motor phase faults such as insulation faults or fault currents and motor phase interruptions in order to prevent further operation of a drive circuit for an electronically commutated motor, for example.

U.S. Pat. No. 6,043,664 A discloses a method and an apparatus for detecting insulation faults in a multi-phase AC motor, in which the voltages of all motor phases with respect to the protective conductor are measured and summed in order to detect the presence of an insulation fault from a comparison of the voltage sum averaged over time with a predefined threshold value.

SUMMARY OF THE INVENTION

The object of the invention is to provide an improved method for detecting a motor phase fault of a motor arrangement, the motor phases of which are connected to a drive circuit.

This object is achieved by the teaching in the independent claims. The dependent claims relate to particularly advantageous configurations and developments of the invention.

In the method according to the invention for detecting a motor phase fault of a motor arrangement, the motor phases of which are connected to a drive circuit having a DC voltage intermediate circuit and an inverter, a motor phase voltage at at least one of the motor phases with respect to a reference potential is captured while the inverter is switched off, and a voltage profile of the captured motor phase voltage is used to determine whether there is a motor phase fault on one of the motor phases of the motor arrangement.

According to the invention, it is proposed to check for the presence of a motor phase fault of a motor arrangement, such as an insulation fault on a motor phase or an interruption in a motor phase of the motor arrangement, while an inverter is switched off and in the process to capture only one motor phase of one or more motor phases in order to be able to detect the presence of a motor phase fault from the voltage profile of the motor phase. The fault check can be carried out in this manner with a simple circuit structure and simple measurement signal evaluation.

The motor arrangement comprises, in particular, a motor and a motor cable for connecting the motor to a drive circuit. The detectable insulation faults on the motor phases include, in particular, insulation faults on the motor phases of the motor cable, in the motor windings and at a neutral point of the motor windings. The detectable interruptions in motor phases include, in particular, severed motor cables and burnt-out motor windings. Such insulation faults and such interruptions in motor phases are referred to together as motor phase faults in connection with the present invention.

In this context, an inverter which is switched off should be understood as meaning an inverter which does not actively energize the connected motor. This can be achieved, in particular, by virtue of all power semiconductor switches of the inverter being switched off or open. The fault check can be carried out by switching on the inverter before starting the motor or by switching off the inverter in an operating pause of the motor. The fault check is preferably carried out when the inverter is switched off and the motor is also at a standstill, with the result that the rotor of the motor also does not rotate and could thereby induce voltages which could influence the detection of a motor phase fault.

The invention is not restricted to a special type of motor. The motor in the motor arrangement is, in particular, an electronically commutated motor, for example a synchronous motor or an asynchronous motor, an AC motor, a three-phase motor or the like.

The DC voltage intermediate circuit of the drive circuit preferably has an intermediate circuit capacitor. The inverter of the drive circuit preferably has an inverter bridge circuit, preferably having a plurality of power semiconductor switches (for example MOSFETs or IGBTs having diodes with an antiparallel connection). The inverter preferably has a multi-phase configuration in a manner corresponding to the connected motor.

The DC voltage intermediate circuit of the drive circuit is preferably connected, via a rectifier, to an AC connection, to which the respective supply network can be connected. The drive circuit may be connected, for example, to single-phase power supply systems, three-phase power supply systems, single-phase three-wire networks (USA) or the like. Accordingly, the rectifier of the drive circuit is preferably in the form of a bridge rectifier or a push-pull rectifier with a plurality of rectifier diodes.

In one configuration of the invention, at least one motor phase is connected to a first reference potential via at least one first resistor and is connected to a second reference potential via at least one further resistor in order to then capture an accordingly divided motor phase voltage of the selected motor phase. The second reference potential is a reference potential which differs from the first reference potential. The first reference potential is, for example, the negative pole of the DC voltage intermediate circuit or earth; the second reference potential is, for example, the positive pole of the DC voltage intermediate circuit. The sum of the resistance values of the at least one first resistor preferably has a high value and is approximately one megohm, for example. Optionally, the sum of the resistance values of the at least one further resistor may also preferably have a high value. If the drive circuit is connected to single-phase or multi-phase power supply systems, the sum of the resistance values of the at least one first resistor and the sum of the resistance values of the at least one further resistor may preferably be selected to be the same; in contrast, if the drive circuit is connected to a single-phase three-wire network (USA), they should be selected to be different. With this embodiment variant, it is possible to easily carry out a fault check in order to determine whether there is an insulation fault on one of the motor phases.

In an alternative configuration of the invention, a first motor phase is connected to a first reference potential via at least one first resistor and the other motor phases are each connected to a second reference potential via at least one further resistor in order to then capture an accordingly divided motor phase voltage of the first motor phase. The second reference potential is a reference potential which differs from the first reference potential. The first reference potential is, for example, the negative pole of the DC voltage intermediate circuit or earth; the second reference potential is, for example, the positive pole of the DC voltage intermediate circuit. The sum of the resistance values of the at least one first resistor preferably has a high value and is approximately one megohm, for example. The sum of the resistance values of the at least one further resistor likewise preferably has a high value in each case. If the drive circuit is connected to single-phase or multi-phase power supply systems and in the case of a total of three motor phases, the sum of the resistance values of the at least one further resistor is preferably twice as large as the sum of the resistance values of the at least one first resistor in each case. With this embodiment variant, it is possible to easily carry out a fault check which can be used to detect the presence of an insulation fault on one of the motor phases or an interruption in a motor phase.

In one configuration of the invention, the motor phase voltage or the divided motor phase voltage is captured by a voltage divider. The measurement voltage measured by means of a voltage divider can advantageously be evaluated by an analogue/digital converter, for example of a microcontroller. The voltage divider is preferably formed by two resistors of the at least one first resistance between the one motor phase or the first motor phase and the first reference potential.

In a further configuration of the invention, a fault current value of an insulation fault during the fault check and/or a resistance value of the insulation fault and/or a maximum possible fault current value of the insulation fault can be quantitatively calculated during operation with the inverter switched on on the basis of the captured motor phase voltage.

In the last-mentioned configuration, the fault current value of the insulation fault during the fault check and/or the resistance value of the insulation fault is/are preferably calculated solely on the basis of the resistance values of the at least one first resistor and the at least one further resistor, a measurement voltage of the divided motor phase voltage, as captured by the voltage divider, a network voltage of the supply network and an intermediate circuit voltage across the DC voltage intermediate circuit. The specific calculation formula depends in this case on the type of supply network, to which the drive circuit is connected, and the corresponding rectifier. In addition, the specific calculation formula depends on whether the motor phase voltage is captured and evaluated in a positive half-wave or a negative half-wave of the network voltage.

In addition, in the last-mentioned configuration, the maximum possible fault current value of the insulation fault during operation with the inverter switched on can likewise be calculated solely on the basis of the resistance values of the at least one first resistor and the at least one further resistor, a measurement voltage of the divided motor phase voltage, as captured by the voltage divider, the network voltage of the supply network and the intermediate circuit voltage across the DC voltage intermediate circuit. The specific calculation formula also depends in this case on the type of supply network, to which the drive circuit is connected, and the corresponding rectifier. In addition, the specific calculation formula depends on whether the motor phase voltage is captured and evaluated in a positive half-wave or a negative half-wave of the network voltage.

In this context, the maximum possible fault current is the greatest possible fault current which flows during normal motor operation with the inverter of the drive circuit switched on. It is indeed not possible to determine during the fault check according to the invention whether the determined insulation fault is on one of the motor phases or at the motor neutral point. Nevertheless, a maximum fault current can be defined as the quotient of the intermediate circuit voltage and the determined resistance value of the insulation fault. That is to say, the maximum fault current occurs whenever the intermediate circuit voltage is present across the insulation fault. This is either the case when the motor phase affected by the insulation fault is switched to high or when, in the case of an insulation fault from the neutral point with respect to protective earth, the drive circuit switches the motor to the zero vector (all motor phases are simultaneously at high) and the neutral point therefore assumes the intermediate circuit voltage.

The invention also relates to a method for operating a drive circuit having a DC voltage intermediate circuit and an inverter for driving an electronically commutated motor, wherein the motor phases of a motor arrangement containing the motor are connected to the inverter of the drive circuit. The presence of a motor phase fault of the motor arrangement is checked in accordance with the above-described method of the invention for detecting a motor phase fault. Switching-on of the inverter and/or of a power factor correction filter (if present) of the drive circuit after capturing the motor phase voltage is prevented if a motor phase fault has been determined using this method.

The invention also relates to a method for operating a drive circuit having a DC voltage intermediate circuit, a power factor correction filter and an inverter for driving an electronically commutated motor. The motor phases of a motor arrangement containing the motor are connected to the inverter of the drive circuit. The presence of a motor phase fault of the motor arrangement is checked in accordance with the above-described method of the invention for detecting a motor phase fault. The power factor correction filter of the drive circuit is switched off when driving the motor after capturing the motor phase voltage, in order to drive the motor at low power, if a maximum possible fault current value for an insulation fault on a motor phase below a predefined limit value has been determined using this method. In this case, a fault signal can preferably also be generated for the user or the customer service. The predefined limit value for the fault current is preferably 6 mA (for example when using a residual current device (RCD) of type A) or 10 mA (for example when using a fault current circuit breaker of type F).

The invention also relates to a drive circuit for driving an electronically commutated motor, which has a DC voltage intermediate circuit and an inverter, which is connected to the DC voltage intermediate circuit and to which the motor phases of a motor arrangement containing the motor can be connected, and is also characterized by a detection circuit for capturing a motor phase voltage at at least one of the motor phases with respect to a reference potential and a control device which is configured to operate the detection circuit for capturing the motor phase voltage while the inverter is switched off and to determine, on the basis of a voltage profile of the captured motor phase voltage, whether there is a motor phase fault on one of the motor phases of the motor arrangement.

The same advantages as those achieved with the above-described method for detecting a motor phase fault can be achieved with this drive circuit. With respect to the advantageous configurations and explanation of terms, reference is likewise additionally made to the above statements in connection with the method for detecting a motor phase fault.

In one configuration of the invention, the detection circuit has at least one first resistor, via which at least one motor phase is connected to a first reference potential, and at least one further resistor, via which at least one motor phase is connected to a second reference potential. The second reference potential is a reference potential which differs from the first reference potential. The first reference potential is, for example, the negative pole of the DC voltage intermediate circuit or earth; the second reference potential is, for example, the positive pole of the DC voltage intermediate circuit. The sum of the resistance values of the at least one first resistor preferably has a high value and is approximately one megohm, for example. Optionally, the sum of the resistance values of the at least one further resistor may also preferably have a high value. If the drive circuit is connected to single-phase or multi-phase power supply systems, the sum of the resistance values of the at least one first resistor and the sum of the resistance values of the at least one further resistor may preferably be selected to be the same; in contrast, if the drive circuit is connected to a single-phase three-wire network (USA), they should be selected to be different. With the detection circuit of this embodiment variant, it is possible to easily carry out a fault check in order to determine whether there is an insulation fault on one of the motor phases.

In an alternative configuration of the invention, the detection circuit has at least one first resistor, via which a first motor phase of the motor phases is connected to a first reference potential, and at least one further resistor, via which another motor phase of the motor phases is respectively connected to a second reference potential. The second reference potential is a reference potential which differs from the first reference potential. The first reference potential is, for example, the negative pole of the DC voltage intermediate circuit or earth; the second reference potential is, for example, the positive pole of the DC voltage intermediate circuit. The sum of the resistance values of the at least one first resistor preferably has a high value and is approximately one megohm, for example. The sum of the resistance values of the at least one further resistor likewise preferably has a high value in each case. If the drive circuit is connected to single-phase or multi-phase power supply systems and in the case of a total of three motor phases, the sum of the resistance values of the at least one further resistor is preferably twice as large as the sum of the resistance values of the at least one first resistor in each case. With the detection circuit of this embodiment variant, it is possible to easily carry out a fault check which can be used to detect the presence of an insulation fault on one of the motor phases or an interruption in a motor phase.

In one configuration of the invention, the detection circuit has a voltage divider for capturing the motor phase voltage.

In a further configuration of the invention, the control device is also configured to prevent switching-on of the inverter and/or of a power factor correction filter (if present) after capturing the motor phase voltage if a motor phase fault has been determined.

Other features which are considered as characteristic for the invention are set forth in the appended claims.

Although the invention is illustrated and described herein as embodied in a method for detecting a motor phase fault of a motor arrangement and drive circuit for driving an electronically commutated motor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
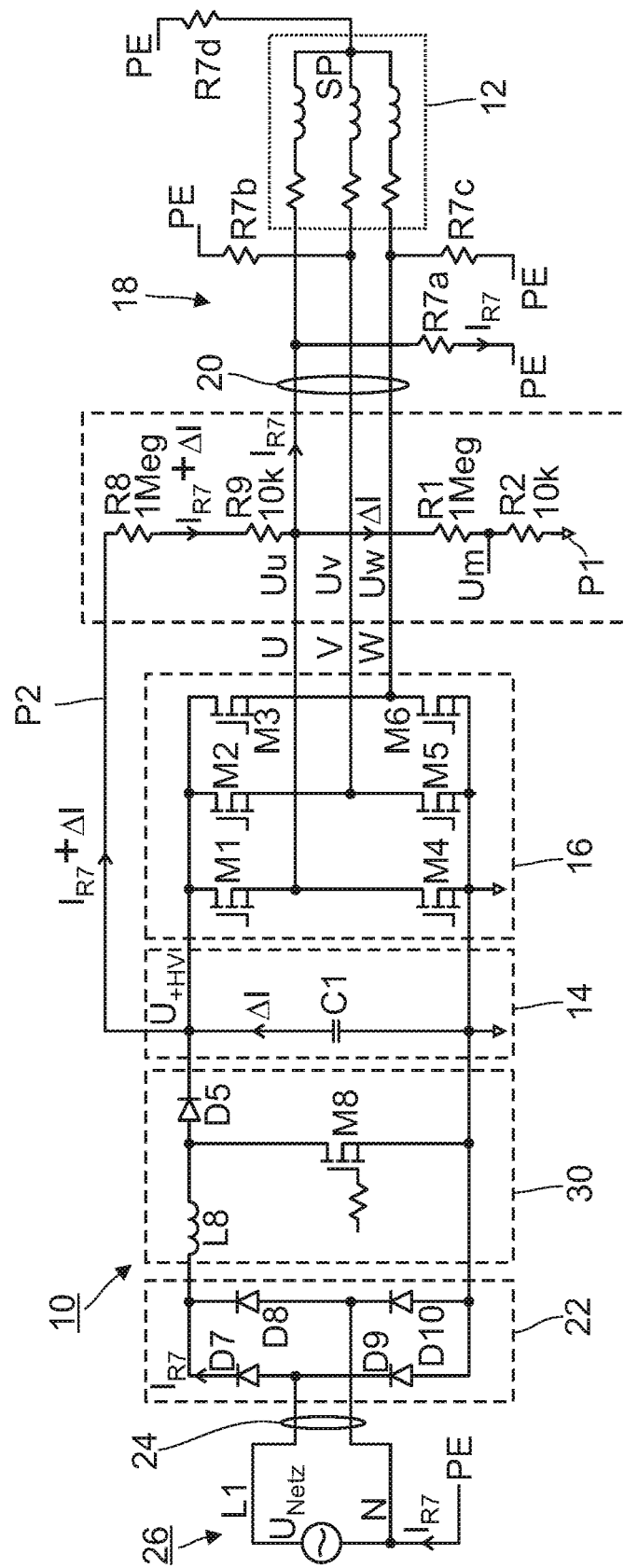
FIG. 1 is a circuit diagram of a drive circuit with a connected motor according to a first exemplary embodiment of the invention.
Figure 2:
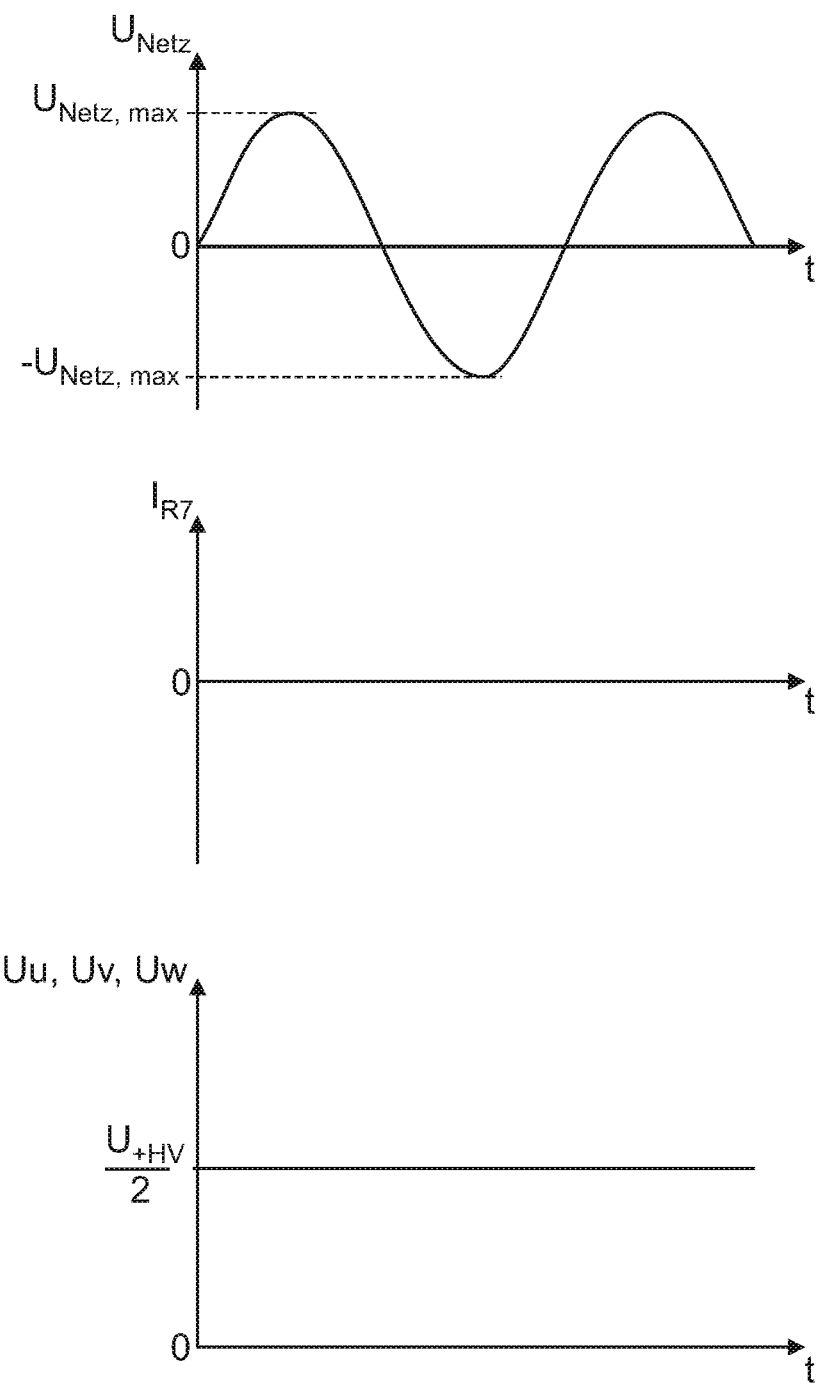
FIG. 2 shows graphs of a network voltage, a fault current and motor phase voltages during fault check for the drive circuit from FIG. 1 in a fault-free case without insulation faults.
Figure 3:
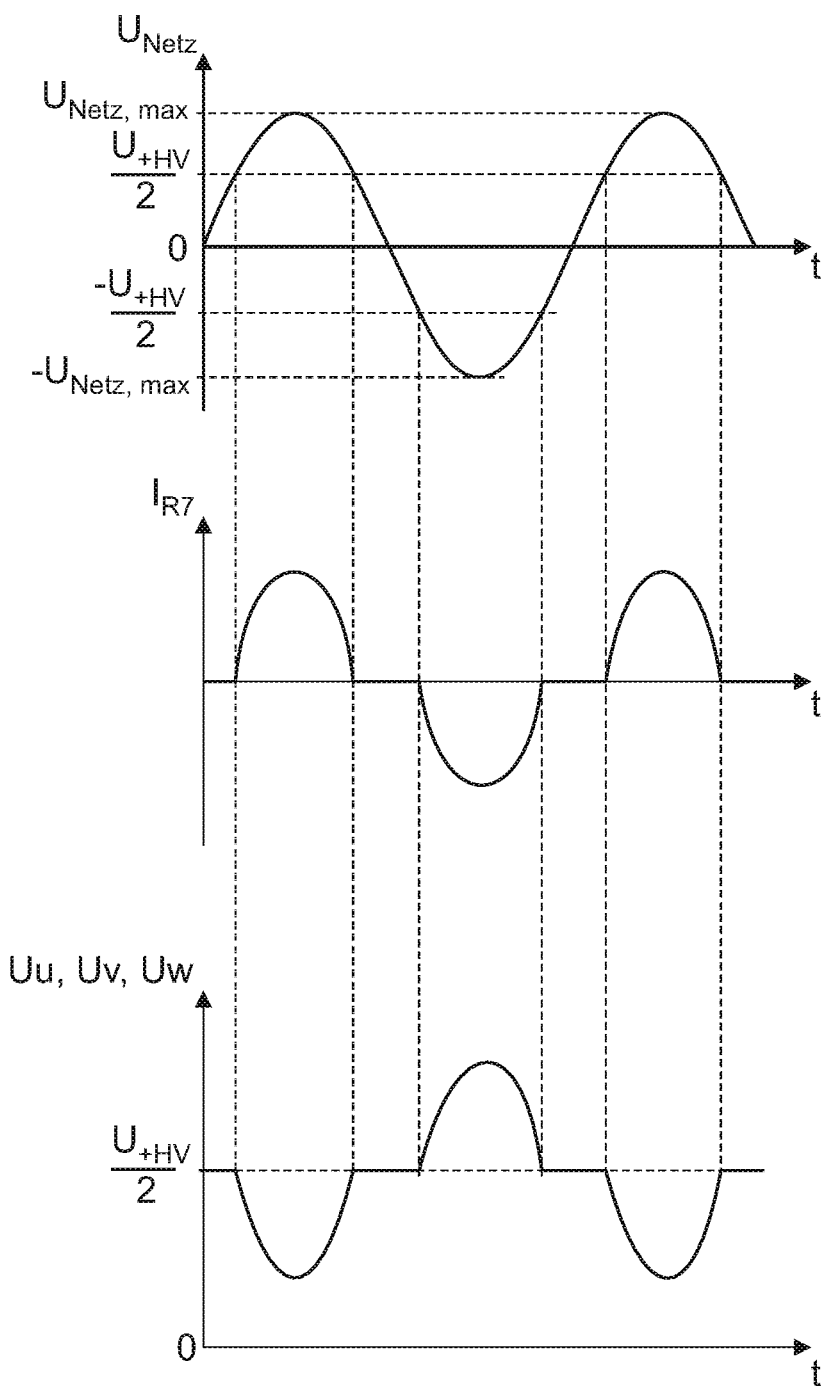
FIG. 3 shows graphs of the network voltage, the fault current and the motor phase voltages during the fault check for the drive circuit from FIG. 1 in the case of an insulation fault on one of the motor phases.

Referring now to the figures of the drawings in detail and first, particularly to FIGS. 1-3 thereof, there is shown the structure and method of operation of a drive circuit 10 for an electronically commutated motor 12 according to a first exemplary embodiment are explained in more detail.

The drive circuit 10 is used to drive an electronically commutated motor 12. In the exemplary embodiment from FIG. 1, the motor is a three-phase brushless motor 12 having three motor phases U, V, W which are connected to one another at a neutral point SP. The motor 12 is fed from a DC voltage intermediate circuit 14 via an inverter 16. The DC voltage intermediate circuit 14 has an intermediate circuit capacitor C1, and the inverter 16 has a three-phase inverter bridge circuit in this exemplary embodiment having a total of six power semiconductor switches M1 to M6 (for example MOSFETs or IGBTs having diodes with an anti-parallel connection) in its half-bridges. The three motor windings of the motor 12 are connected, via a motor cable 18, to a motor phase connection 20 which is connected to the three center taps of the half-bridges of the inverter 16. The motor 12 and the motor cable 18 each have three motor phases U, V, W and are parts of the motor arrangement.

On the input side, the DC voltage intermediate circuit 14 is connected to an AC connection 24 via a rectifier 22. The drive circuit 10 is connected to a supply network 26 via the AC connection 24. In the exemplary embodiment from FIG. 1, the supply network 26 is a single-phase power supply system, the drive circuit 10 is connected to the phase conductor L1 and to the neutral conductor N of the single-phase power supply system, and the supply network 26 also has protective earthing PE. In this exemplary embodiment, the rectifier 22 has a rectifier bridge circuit with a total of four rectifier diodes D7 to D10.

Optionally, a power factor correction filter (PFC filter) 30 can also be connected between the rectifier 22 and the DC voltage intermediate circuit 14. The PFC filter 30 may be configured in a boost converter topology in this example and contains, in particular, an inductance L8, a switch M8 and a rectifier diode D5. The PFC filter 30 may optionally also be present in the other exemplary embodiments, even though it is not depicted in FIGS. 4, 7 and 10.

The drive circuit 10 also has a non-illustrated control device, for example in the form of a microcontroller, which controls the power semiconductor switches M1 to M6 of the inverter 16.

In the case of such a drive circuit 10, there are various types of motor phase faults which can occur on the side of the connected motor 12. Insulation faults of the motor phases in the motor cable 18 and insulation faults of the neutral point SP of the motor windings of the motor 12 may arise. The various types of insulation faults are illustrated in FIG. 1 as insulation faults with the resistors R7a, R7b, R7c for the motor phases U, V, W of the motor cable 18 and with the resistor R7d for the neutral point SP of the motor windings of the motor 12.

The drive circuit 10 has a detection circuit 28 for the purpose of detecting all of these insulation faults R7a, R7b, R7c, R7d.

In addition, interruptions in the motor phases U, V, W can arise on account of a severed motor cable 18 or a burnt-out motor winding of the motor 12. FIG. 1 indicates, by way of example, an interruption X in the motor phase U in the motor cable 18. In order to detect such interruptions X in motor phases U, V, W, the drive circuit 10 may alternatively have a detection circuit 28' which is illustrated, by way of example, in FIG. 13 and is described in more detail later.

The detection circuit 28 from FIG. 1 captures the motor phase voltage Uu of the motor phase U (generally at least one of the motor phases U, V, W) with the inverter 16 switched off and preferably also with the PFC filter 30 (if present) switched off. For this purpose, the motor phase U is connected, in a high-impedance manner, to the negative pole of the DC voltage intermediate circuit 14 or to earth as the first reference potential P1 via first resistors R1, R2 and is connected, in a high-impedance manner, to the positive pole of the DC voltage intermediate circuit 14 as the second reference potential P2 via further resistors R8, R9. The first resistors R1, R2 are also used as a voltage divider for capturing the divided motor phase voltage Uu as the measurement voltage Um which can be evaluated by an analogue/digital converter of the control device. In the motor phase fault detection method according to the invention, it suffices to capture one of the motor phase voltages, but motor phase voltages of a plurality of motor phases can optionally also be captured and evaluated.

The inverter 16 is switched off by switching off/opening all power semiconductor switches M1 . . . M6 of the inverter 16, with the result that the motor 12 connected to the motor phase connection 20 is not actively energized by the drive circuit 10. The fault check is preferably carried out by the detection circuit 28 not only when the inverter 16 is switched off, but also when the motor is at a standstill, with the result that no voltages can be induced by a rotor of the motor 12 which is still rotating.

In the exemplary embodiment from FIG. 1, the sum of the resistance values of the first resistors R1, R2 is selected to be equal to the sum of the resistance values of the further resistors R8, R9, wherein these sums of the resistance values are each approximately 1 megohm. As a result, the motor phase voltage Uu assumes half the value of the intermediate circuit voltage $U_{+HV}$ across the DC voltage intermediate circuit 14 in the fault-free state. Instead of the two further resistors R8, R9, only an individual resistor R8 may also be provided.

It is now described, on the basis of FIGS. 1 to 3, how the presence of an insulation fault R7a, R7b, R7c, R7d can be detected with the aid of this detection circuit 28. In this respect, the current arrows of the fault current $I_{R7}$ and of the capacitor current $\Delta I$ from the DC voltage intermediate circuit 14 are depicted, by way of example, in FIG. 1 in the positive half-wave of the network voltage $U_{Netz}$ of the supply network 26 with the inverter 16 switched off and with power semiconductor switches M1 . . . 6 switched off/open.

The graphs from FIG. 2 show the temporal profiles of the network voltage $U_{Netz}$, the fault current $I_{R7}$ and the motor phase voltages Uu, Uv, Uw in the fault-free case without an insulation fault, and the graphs from FIG. 3 show the temporal profiles of the network voltage $U_{Netz}$, the fault current $I_{R7}$ and the motor phase voltages Uu, Uv, Uw in the case of an insulation fault, in each case during the fault check. The curve profiles from FIGS. 2 and 3 show the case of a fault check with the PFC filter 30 switched off; however, the fault check can also be carried out in a similar manner with the PFC filter 30 switched on.

Since the insulation fault resistance is infinite in the fault-free case, the motor phase voltage Uu (for the case of R1+R2=R8+R9) assumes half the intermediate circuit voltage $U_{+HV}/2$. As a comparison of the graphs in FIGS. 2 and 3 shows, a voltage profile of the motor phase voltage Uu can be used to easily detect whether or not there is an insulation fault on the side of the motor arrangement 12, 18.

The fault current $I_{R7}$ flows only when the diode D7 of the rectifier 22 is conductive in the positive half-wave of the network voltage $U_{Netz}$ and the diode D9 of the rectifier 22 is conductive in the negative have-wave of the network voltage $U_{Netz}$. When the inverter 16 is switched off, this state occurs only when the network voltage $U_{Netz}$ exceeds half the value of the intermediate circuit voltage $U_{+HV}/2$. As illustrated in FIG. 3, a fault current $I_{R7}$ for this reason flows only when the magnitude of the network voltage $U_{Netz}$ is greater than half the intermediate circuit voltage $U_{+HV}/2$.

The motor phase voltage Uu can be expressed as a function of the measured divided voltage Um by means of a simple voltage divider formula:

$$Uu = \frac{R1 + R2}{R2} * Um.$$

In the positive half-wave of the network voltage $U_{Netz}$, the insulation fault resistance R7 can be calculated by means of the following expression:

$$R7 = \frac{(R8 + R9) * \left(U_{Netz} - U_{+HV} + \frac{Um * (R1 + R2)}{R2}\right)}{2 * Uu - U_{+HV}}$$

and in the negative half-wave of the network voltage $U_{Netz}$, the insulation fault resistance R7 can be calculated by means of the following expression:

$$R7 = -\frac{U_{Netz} - \frac{R1 + R2}{R2} * Um}{\frac{Um}{R2} - \left(U_{+HV} - \frac{R1 + R2}{R2} * Um\right) / (R8 + R9)}$$

In the positive half-wave of the network voltage $U_{Netz}$, the fault current $I_{R7}$ during the fault check can be calculated by means of the following expression:

$$I_{R7} = -\frac{U_{+HV} - \frac{R8 + R9 + R1 + R2}{R2} * Um}{R8 + R9}$$

and in the negative half-wave of the network voltage $U_{Netz}$, the fault current $I_{R7}$ during the fault check can be calculated by means of the following expression:

$$I_{R7} = \frac{Um}{R2} - \frac{U_{+HV} - \frac{R1 + R2}{R2} * Um}{R8 + R9}$$

The maximum possible fault current $I_{R7,max}$ during operation with the inverter 16 switched on can be determined, on the basis of the quotient of the intermediate circuit voltage and the determined resistance value R7 of the insulation fault, during the positive half-wave of the network voltage $U_{Netz}$ by means of the following expression:

$$I_{R7,max} = \frac{U_{+HV}}{R7} = -\frac{U_{+HV} * (2 * Uu - U_{+HV})}{(R8 + R9) * \left(U_{Netz} - U_{+HV} + \frac{Um * (R1 + R2)}{R2}\right)}$$

and in the negative half-wave of the network voltage $U_{Netz}$, the maximum possible fault current $I_{R7,max}$ can be calculated by means of the following expression:

$$I_{R7,max} = \frac{U_{+HV}}{R7} = -\frac{U_{+HV} * \left(\frac{Um}{R2} - \left(U_{+HV} - \frac{R1 + R2}{R2} * Um\right)\right) / (R8 + R9)}{U_{Netz} - \frac{R1 + R2}{R2} * Um}$$

That is to say, the insulation fault resistances R7, the fault current values $I_{R7}$ of the insulation fault and the maximum possible fault current values $I_{R7,max}$ during operation with the inverter 16 switched on can be calculated solely on the basis of the resistance values of the first and further resistors R1, R2, R8, R9 of the detection circuit 28, the measurement voltage Um of the divided motor phase voltage Uu, as captured by the voltage divider R1, R2 of the detection circuit 28, the intermediate circuit voltage $U_{+HV}$ across the DC voltage intermediate circuit 14 and the network voltage $U_{Netz}$.

In addition to the qualitative detection of an insulation fault, a quantitative detection of an insulation fault can also be carried out with the aid of the last two expressions. The maximum possible fault current values $I_{R7,max}$ calculated in this manner can be compared with predefined limit values, for example. An insulation fault is detected, for example, if a fault current value $I_{R7}$ exceeds 6 mA. If, in contrast, only a small maximum possible fault current value $I_{R7,max}$ below a predefined limit value of 6 mA or 10 mA, for example, is determined, the motor 12 can then be operated at possibly low power with the PFC filter 30 switched off and a fault signal can also be transmitted to the user or customer service.

The drive circuit 10 having the detection circuit 28 according to the invention for detecting an insulation fault on the side of the motor arrangement 12, 18 can also be used in combination with other supply networks 26 and accordingly adapted rectifiers 22.

Figure 4:
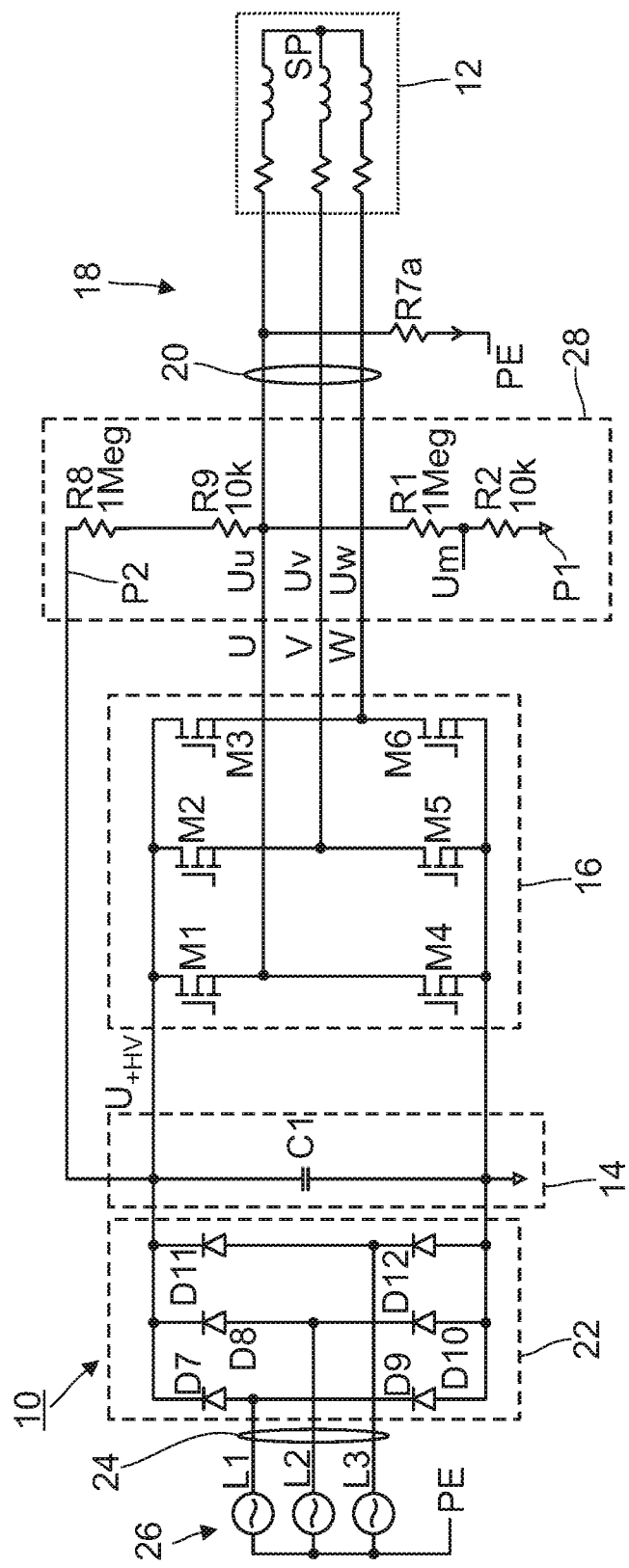
FIG. 4 is a circuit diagram of the drive circuit with the connected motor according to a second exemplary embodiment of the invention.
Figure 5:
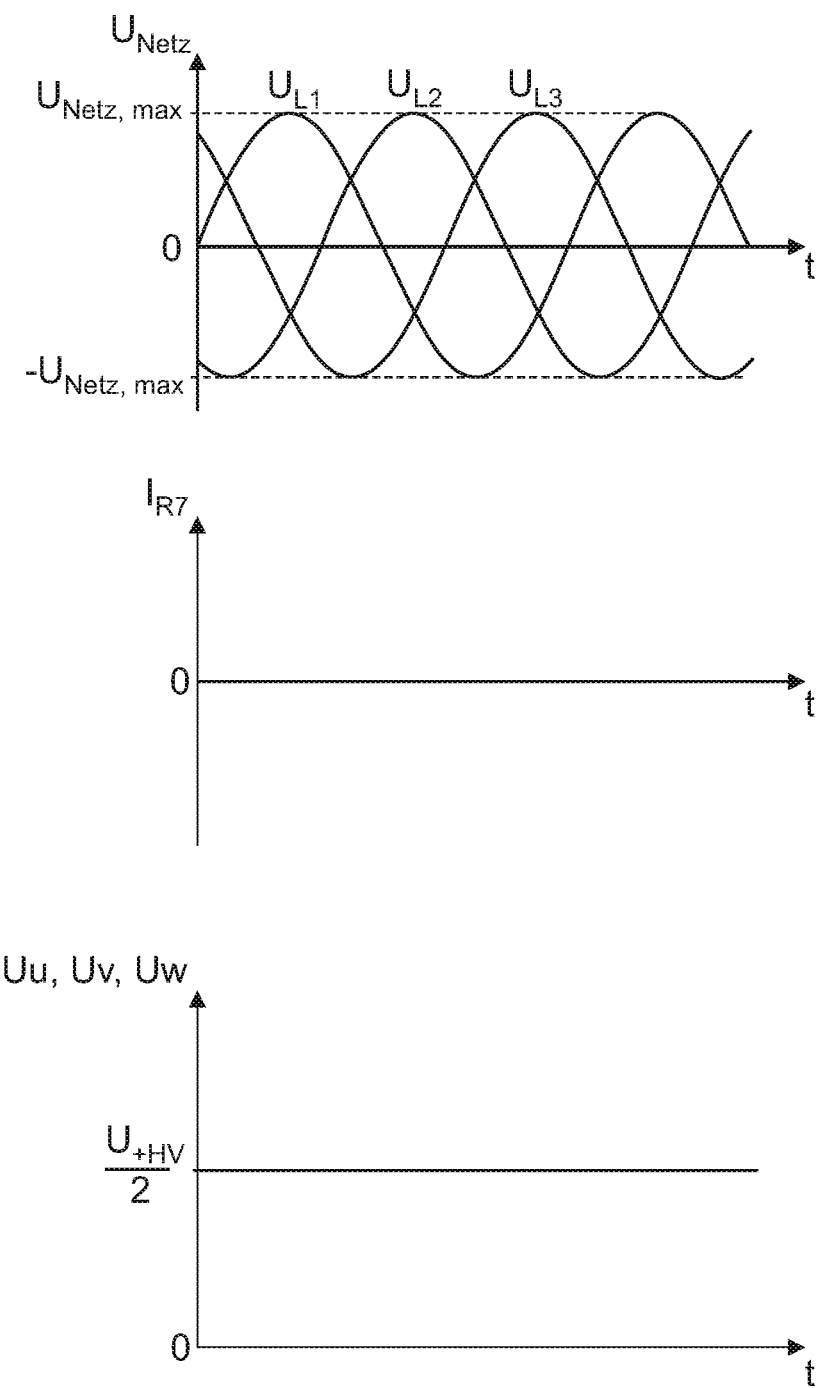
FIG. 5 shows graphs of the network voltage, the fault current and the motor phase voltages during the fault check for the drive circuit from FIG. 4 in the fault-free case without insulation faults.
Figure 6:
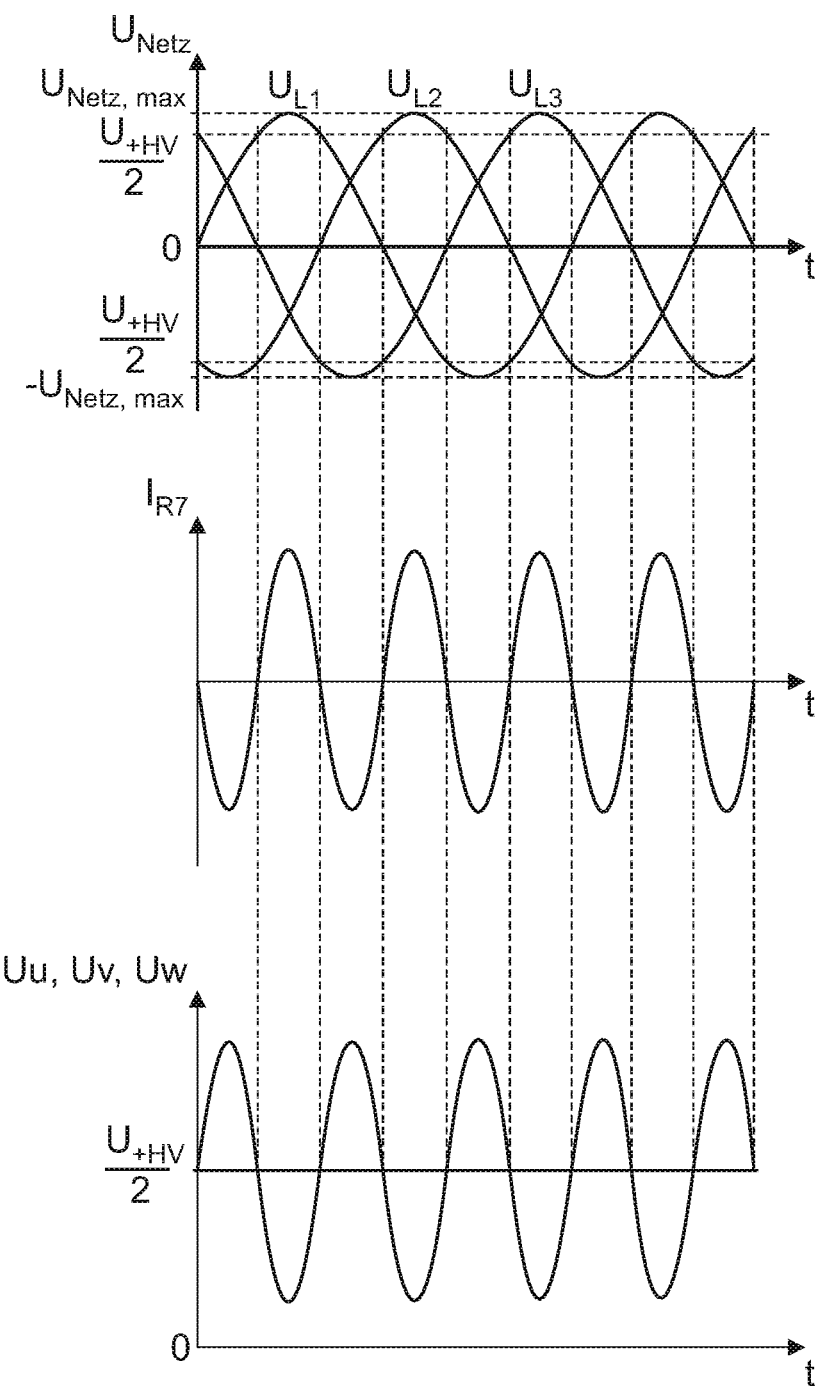
FIG. 6 shows graphs of the network voltage, the fault current and the motor phase voltages during the fault check for the drive circuit from FIG. 4 in the case of an insulation fault on one of the motor phases.

Referring to FIGS. 4 to 6, the structure and method of operation of a drive circuit for an electronically commutated motor according to a second exemplary embodiment are explained in more detail. In this case, identical or corresponding components and parameters are provided with the same reference signs as in the first exemplary embodiment.

In the exemplary embodiment from FIG. 4, the supply network 26 is a three-phase power supply system, the drive circuit 10 is connected to the phase conductors L1, L2, L3 of the power supply system, and the supply network 26 also has protective earthing PE. In this exemplary embodiment, the rectifier 22 has a rectifier bridge circuit with a total of six rectifier diodes D7 to D12. For the rest, the drive circuit 10 corresponds to that in the first exemplary embodiment from FIG. 1.

The graphs from FIG. 5 show the temporal profiles of the network voltage $U_{Netz}$, the fault current $I_{R7}$ and the motor phase voltages Uu, Uv, Uw in the fault-free case without an insulation fault, and the graphs from FIG. 6 show the temporal profiles of the network voltage $U_{Netz}$, the fault current $I_{R7}$ and the motor phase voltages Uu, Uv, Uw in the case of an insulation fault, in each case during the fault check. The curve profiles from FIGS. 5 and 6 show the case of a fault check for a drive circuit 10 without a PFC filter 30 or with the PFC filter 30 switched off; however, the fault check can also be carried out in a similar manner with the PFC filter 30 switched on.

Since the insulation fault resistance is infinite in the fault-free case, the motor phase voltage Uu (for the case of R1+R2=R8+R9) assumes half the intermediate circuit voltage $U_{+HV}/2$. As a comparison of the graphs in FIGS. 5 and 6 shows, a voltage profile of the motor phase voltages Uu, Uv, Uw can be used to easily detect whether or not there is an insulation fault on the side of the motor arrangement 12, 18.

In the case of the three-phase power supply system, a fault current $I_{R7}$ continuously flows in the event of a fault because at least one diode D7 . . . 12 of the bridge rectifier 22 is conductive at any time.

The resistance values and fault currents of the insulation fault are calculated in the case of the three-phase power supply system using the same formulas as for the single-phase power supply system in the first exemplary embodiment.

Figure 7:
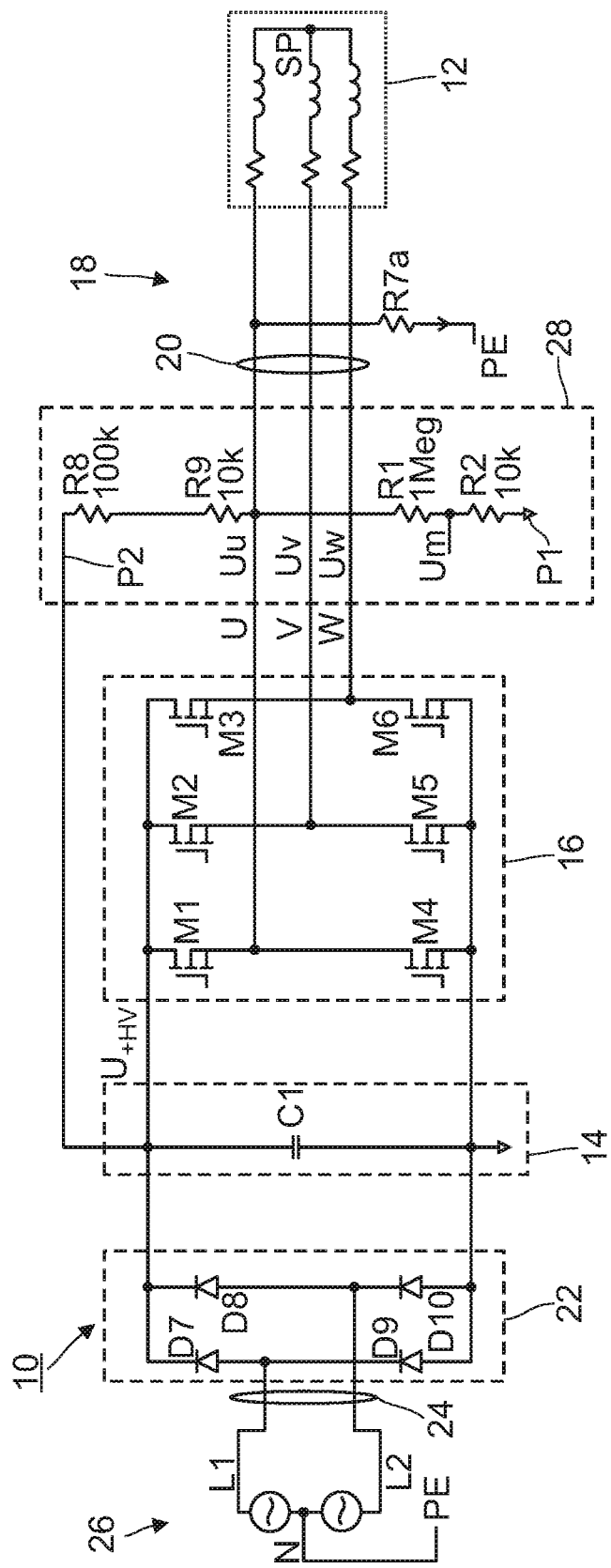
FIG. 7 is a circuit diagram of the drive circuit with the connected motor according to a third exemplary embodiment of the invention.
Figure 8:
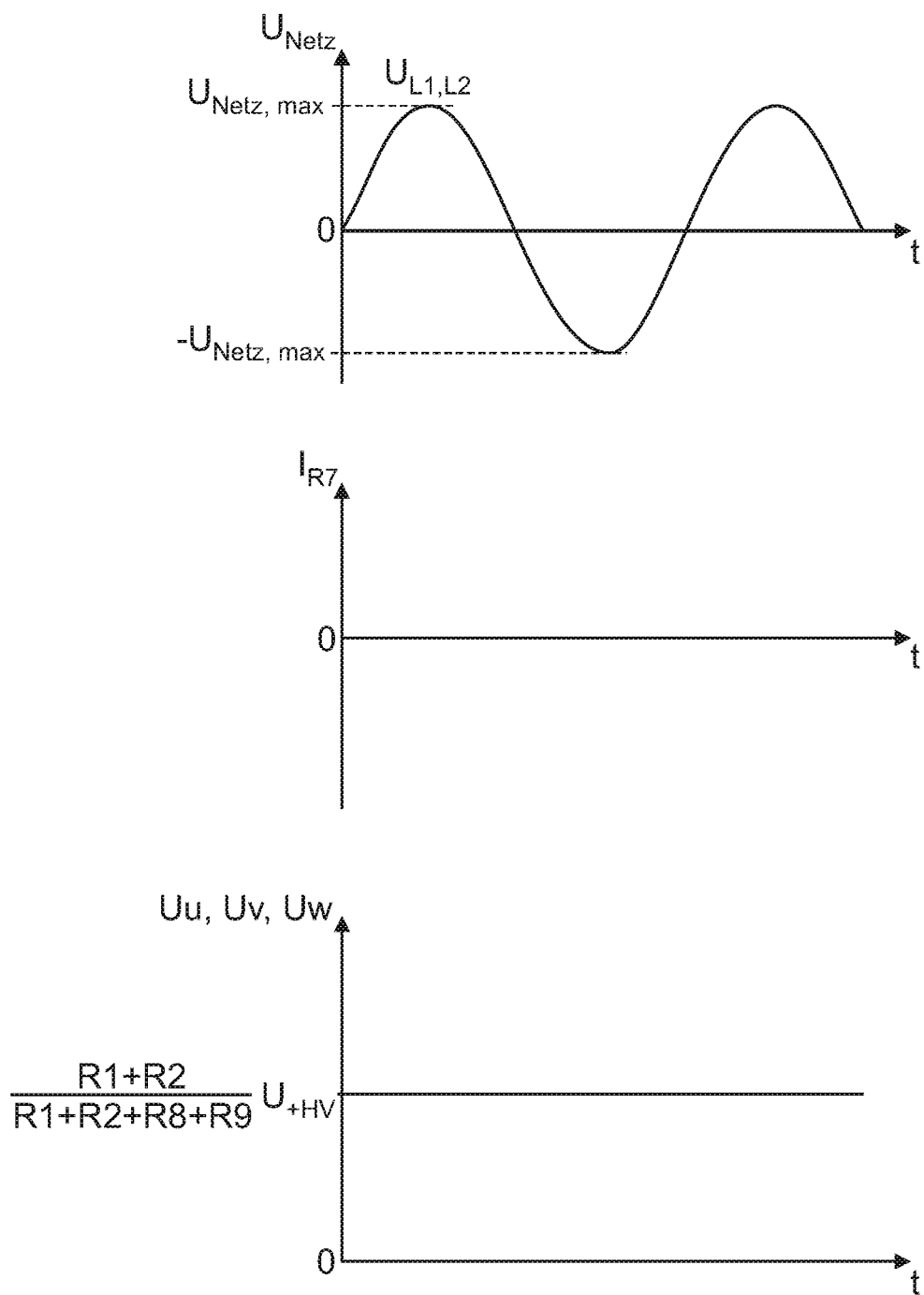
FIG. 8 shows graphs of the network voltage, the fault current and the motor phase voltages during the fault check for the drive circuit from FIG. 7 in the fault-free case without insulation faults.
Figure 9:
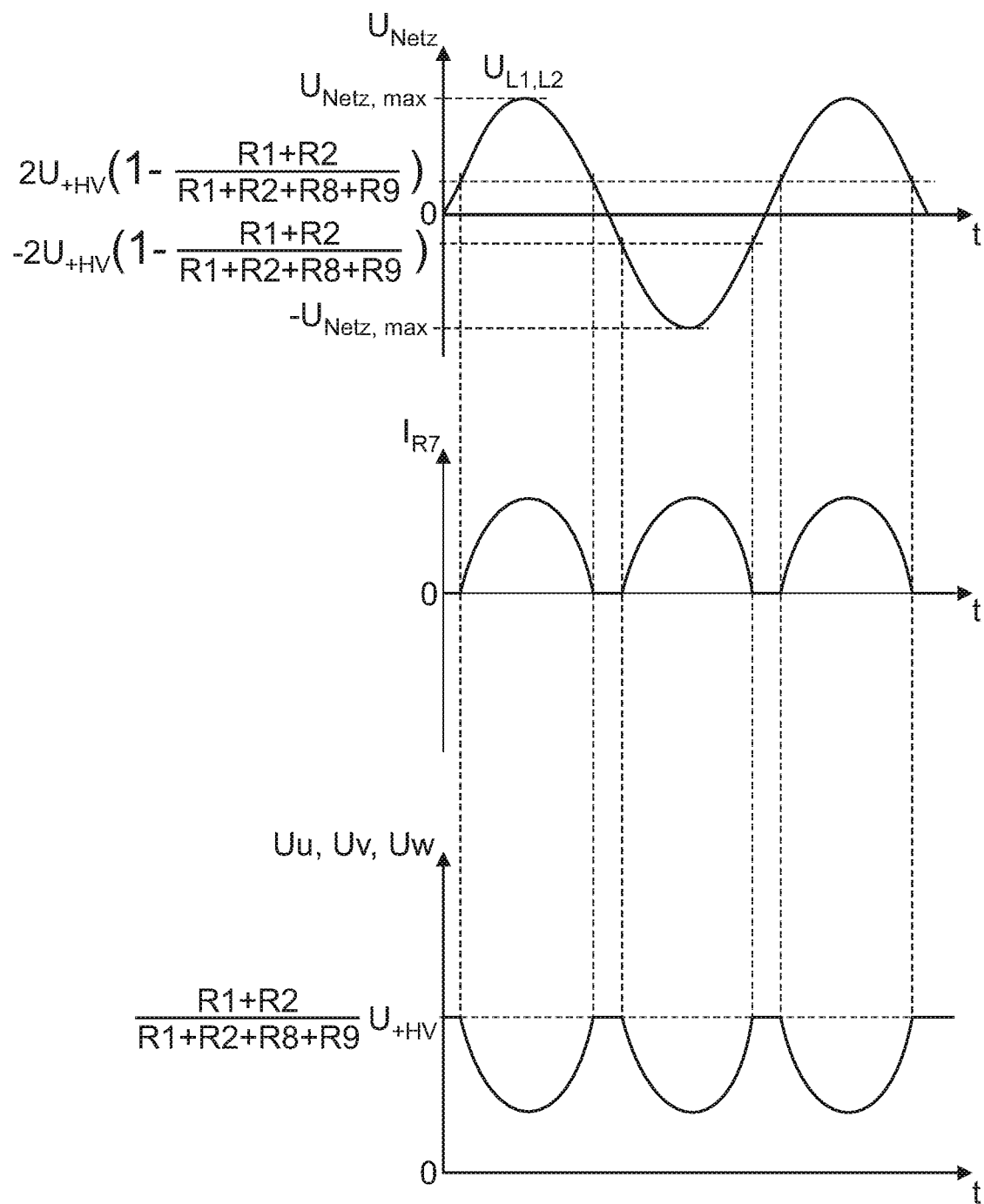
FIG. 9 shows graphs of the network voltage, the fault current and the motor phase voltages during the fault check for the drive circuit from FIG. 7 in the case of an insulation fault on one of the motor phases.

Referring to FIGS. 7 to 9, the structure and method of operation of a drive circuit for an electronically commutated motor according to a third exemplary embodiment are explained in more detail. In this case, identical or corresponding components and parameters are provided with the same reference signs as in the preceding exemplary embodiments.

In the exemplary embodiment from FIG. 7, the supply network 26 is a single-phase three-wire network (USA), the drive circuit 10 is connected to the phase conductors L1, L2 of the three-wire network, and the supply network 26 also has a neutral conductor connected to protective earthing PE. In this exemplary embodiment, the rectifier 22 has a rectifier bridge circuit with a total of four rectifier diodes D7 to D10. For the rest, the structure and method of operation of the drive circuit 10 correspond to those of the first exemplary embodiment from FIG. 1. In contrast to the first exemplary embodiment with a single-phase power supply system, the sums of the first resistances R1, R2 and of the further resistances R8, R9 of the detection circuit 28 must not be equal, however, in the case of the single-phase three-wire network since otherwise a fault current would not flow through the diodes of the rectifier 22. In this case too, however, the one motor phase U is connected, in a high-impedance manner, to the negative pole of the DC voltage intermediate circuit 14.

The graphs from FIG. 8 show the temporal profiles of the network voltage $U_{Netz}$, the fault current $I_{R7}$ and the motor phase voltages Uu, Uv, Uw in the fault-free case without an insulation fault, and the graphs from FIG. 9 show the temporal profiles of the network voltage $U_{Netz}$, the fault current $I_{R7}$ and the motor phase voltages Uu, Uv, Uw in the case of an insulation fault, in each case during the fault check. The curve profiles from FIGS. 8 and 9 show the case of a fault check for a drive circuit 10 without a PFC filter 30 or with the PFC filter 30 switched off; however, the fault check can also be carried out in a similar manner with the PFC filter 30 switched on.

The resistance values and fault currents of the insulation fault are calculated in the case of the single-phase three-wire network using the same formulas as for the single-phase power supply system in the first exemplary embodiment.

In the fault-free case, the motor phase voltage Uu assumes the following value:

$$Uu = \frac{R1 + R2}{R1 + R2 + R8 + R9} * U_{+HV}$$

In the case of the single-phase three-wire network, a fault current $I_{R7}$ flows only when the network voltage between the two outer conductors L1, L2 exceeds the following voltage value:

$$U_{Netz,L1,L2} = 2 * U_{+HV} * \left(1 - \frac{R1 + R2}{R1 + R2 + R8 + R9}\right)$$

Figure 10:
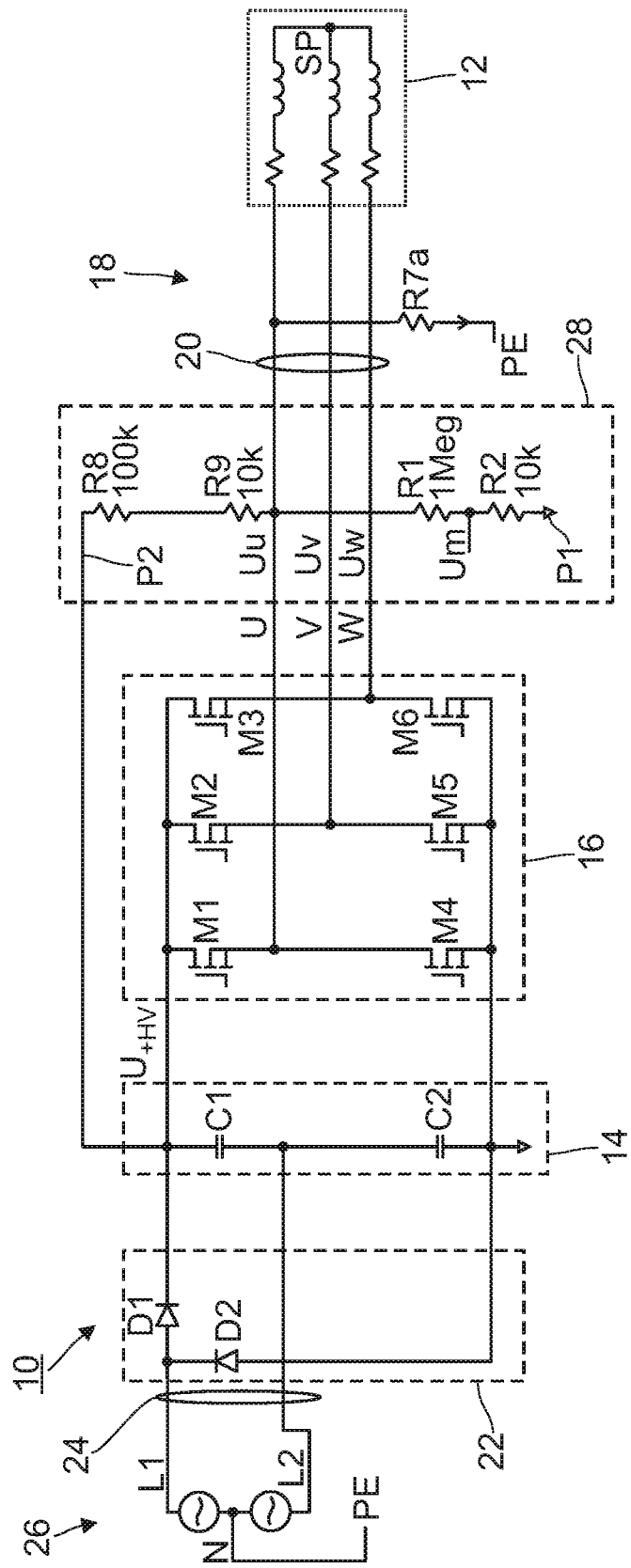
FIG. 10 is a circuit diagram of the drive circuit with the connected motor according to a fourth exemplary embodiment of the invention.
Figure 11:
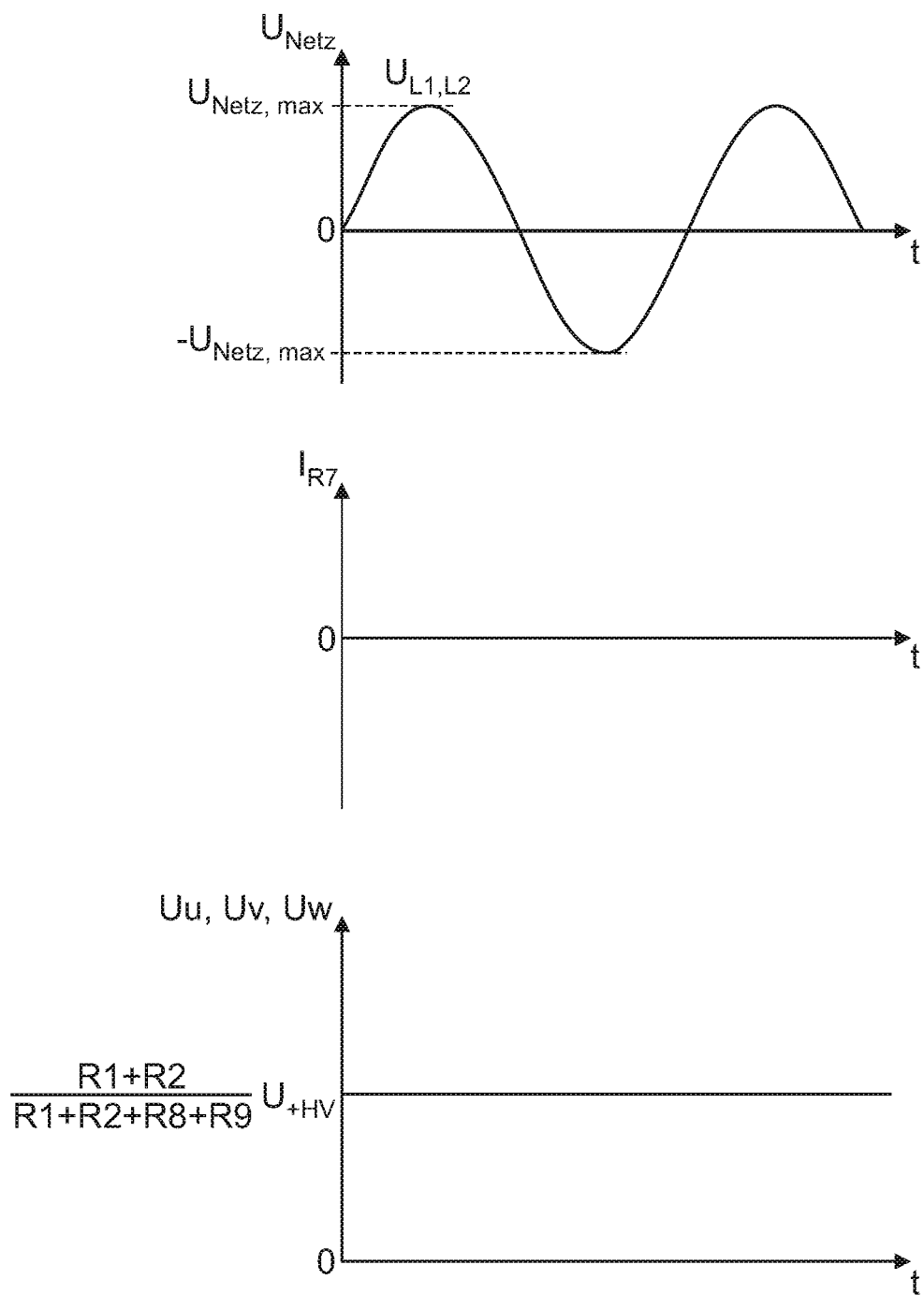
FIG. 11 shows graphs of the network voltage, the fault current and the motor phase voltages during the fault check for the drive circuit from FIG. 10 in the fault-free case without insulation faults.
Figure 12:
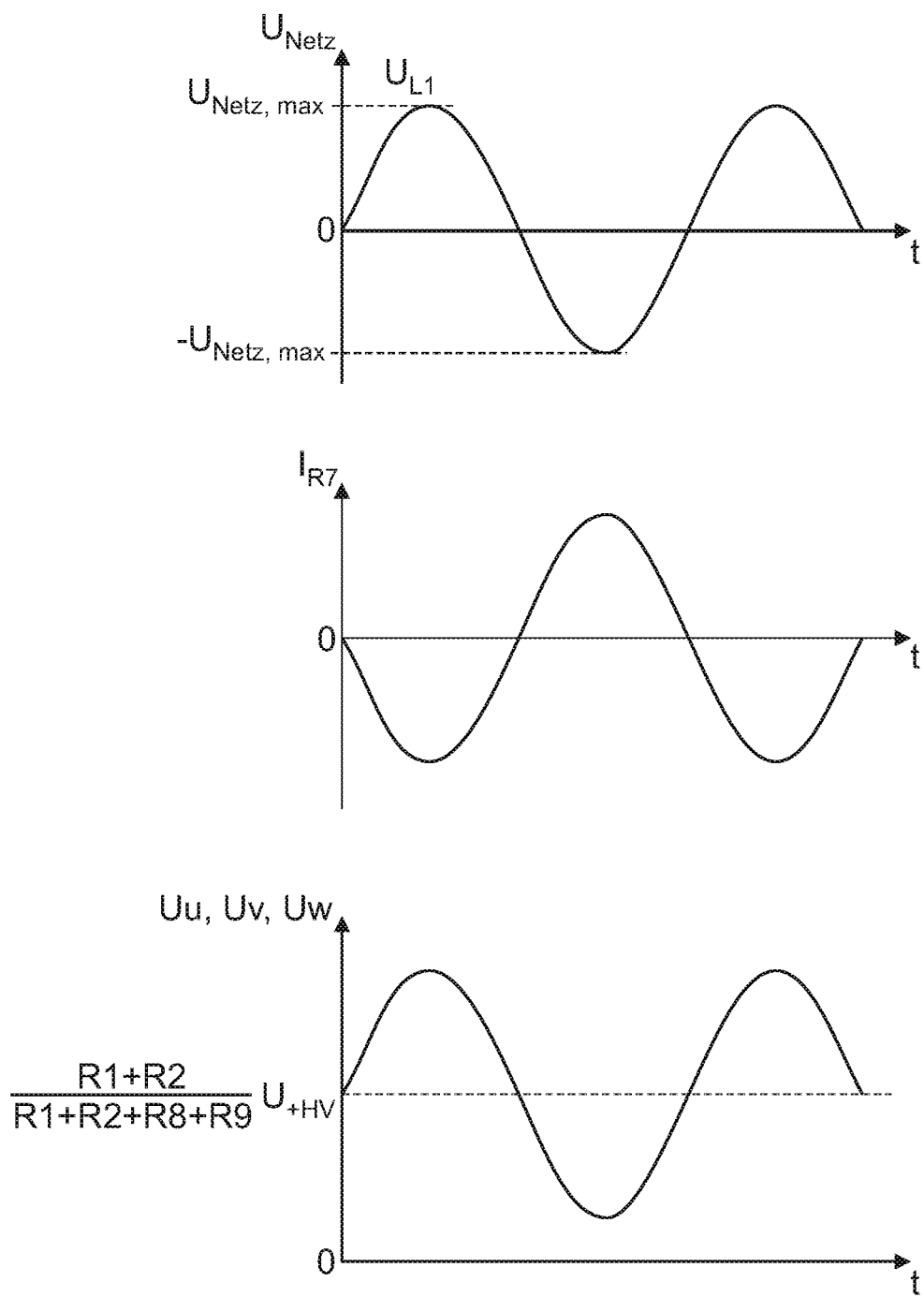
FIG. 12 shows graphs of the network voltage, the fault current and the motor phase voltages during the fault check for the drive circuit from FIG. 10 in the case of an insulation fault on one of the motor phases.

Referring to FIGS. 10 to 12, the structure and method of operation of a drive circuit for an electronically commutated motor according to a fourth exemplary embodiment are explained in more detail. In this case, identical or corresponding components and parameters are provided with the same reference signs as in the preceding exemplary embodiments.

In the exemplary embodiment from FIG. 10, the supply network 26 is a single-phase three-wire network (USA), like in the third exemplary embodiment, the drive circuit 10 is connected to the phase conductors L1, L2 of the three-wire network, and the supply network 26 also has a neutral conductor connected to protective earthing PE. In contrast to the third exemplary embodiment, the rectifier 22 in this exemplary embodiment is in the form of a push-pull rectifier having two rectifier diodes D1 and D2, and the DC voltage intermediate circuit 14 has two intermediate circuit capacitors C1 and C2. For the rest, the structure and method of operation of the drive circuit 10 correspond to those of the first exemplary embodiment from FIG. 1. In contrast to the first exemplary embodiment with a single-phase power supply system, the sums of the first resistances R1, R2 and of the further resistances R8, R9 of the detection circuit 28 must not be equal, however, in the case of the single-phase three-wire network since otherwise a fault current would not flow through the diodes of the rectifier 22. In this case too, however, the one motor phase U is connected, in a high-impedance manner, to the negative pole of the DC voltage intermediate circuit 14.

The graphs from FIG. 11 show the temporal profiles of the network voltage $U_{Netz}$, the fault current $I_{R7}$ and the motor phase voltages Uu, Uv, Uw in the fault-free case without an insulation fault, and the graphs from FIG. 12 show the temporal profiles of the network voltage $U_{Netz}$, the fault current $I_{R7}$ and the motor phase voltages Uu, Uv, Uw in the case of an insulation fault, in each case during the fault check. The curve profiles from FIGS. 11 and 12 show the case of a fault check for a drive circuit 10 without a PFC filter 30 or with the PFC filter 30 switched off; however, the fault check can also be carried out in a similar manner with the PFC filter 30 switched on.

In the fault-free case, the motor phase voltage Uu assumes the following value:

$$Uu = \frac{R1+R2}{R8+R9+R1+R2} * U_{+HV}$$

In the case of the single-phase three-wire network, a fault current $I_{R7}$ flows only when the network voltage between the two outer conductors L1, L2 exceeds the following voltage value:

$$U_{Netz,L1,L2} = 2 * U_{+HV} * \left(1 - \frac{R1+R2}{R8+R9+R1+R2}\right)$$

In the positive half-wave of the network voltage $U_{Netz}$, the insulation fault resistance R7 can be calculated by means of the following expression:

$$R7 = \frac{\left(U_{Netz} + \frac{U_{+HV}}{2} - \frac{R1+R2}{R2}*Um\right)*(R1+R2)}{\frac{R1+R2}{R1}*Um - \frac{U_{+HV} - \frac{R1+R2}{R2}*Um}{R8+R9}*(R1+R2)}$$

and in the negative half-wave of the network voltage $U_{Netz}$, the insulation fault resistance R7 can be calculated by means of the following expression:

$$R7 = \frac{(R8+R9)*\left(U_{Netz} + \frac{R1+R2}{R2}*Um - \frac{U_{+HV}}{2}\right)}{U_{+HV} - \frac{R1+R2}{R2}*Um - (R8+R9)*\frac{Um}{R2}}$$

In the positive half-wave of the network voltage $U_{Netz}$, the fault current $I_{R7}$ during the fault check can be calculated by means of the following expression:

$$I_{R7} = \frac{Um}{R2} - \frac{U_{+HV} - \frac{R1+R2}{R2}*Um}{R8+R9}$$

and in the negative half-wave of the network voltage $U_{Netz}$, the fault current $I_{R7}$ during the fault check can be calculated by means of the following expression:

$$I_{R7} = \frac{U_{+HV} - \frac{R1+R2}{R2}*Um - (R8+R9)*\frac{Um}{R2}}{R8+R9}$$

Accordingly, the maximum possible fault current $I_{R7,max}$ during operation with the inverter 16 switched on during the positive half-wave of the network voltage $U_{Netz}$ can be determined by means of the following expression:

$$I_{R7,max} = \frac{U_{+HV}}{R7} = -\frac{U_{+HV}*\left(\frac{R1+R2}{R2}*Um - \frac{U_{+HV} - \frac{R1+R2}{R2}*Um}{R8+R9}*(R1+R2)\right)}{\left(U_{Netz} + \frac{U_{+HV}}{2} - \frac{R1+R2}{R2}*Um\right)*(R1+R2)}$$

and in the negative half-wave of the network voltage $U_{Netz}$, the maximum possible fault current $I_{R7,max}$ can be calculated by means of the following expression:

$$I_{R7,max} = \frac{U_{+HV}}{R7} = -\frac{U_{+HV}*\left(U_{+HV} - \frac{R1+R2}{R2}*Um - (R8+R9)*\frac{Um}{R2}\right)}{(R8+R9)*\left(U_{Netz} + \frac{R1+R2}{R2}*Um - \frac{U_{+HV}}{2}\right)}$$

Figure 13:
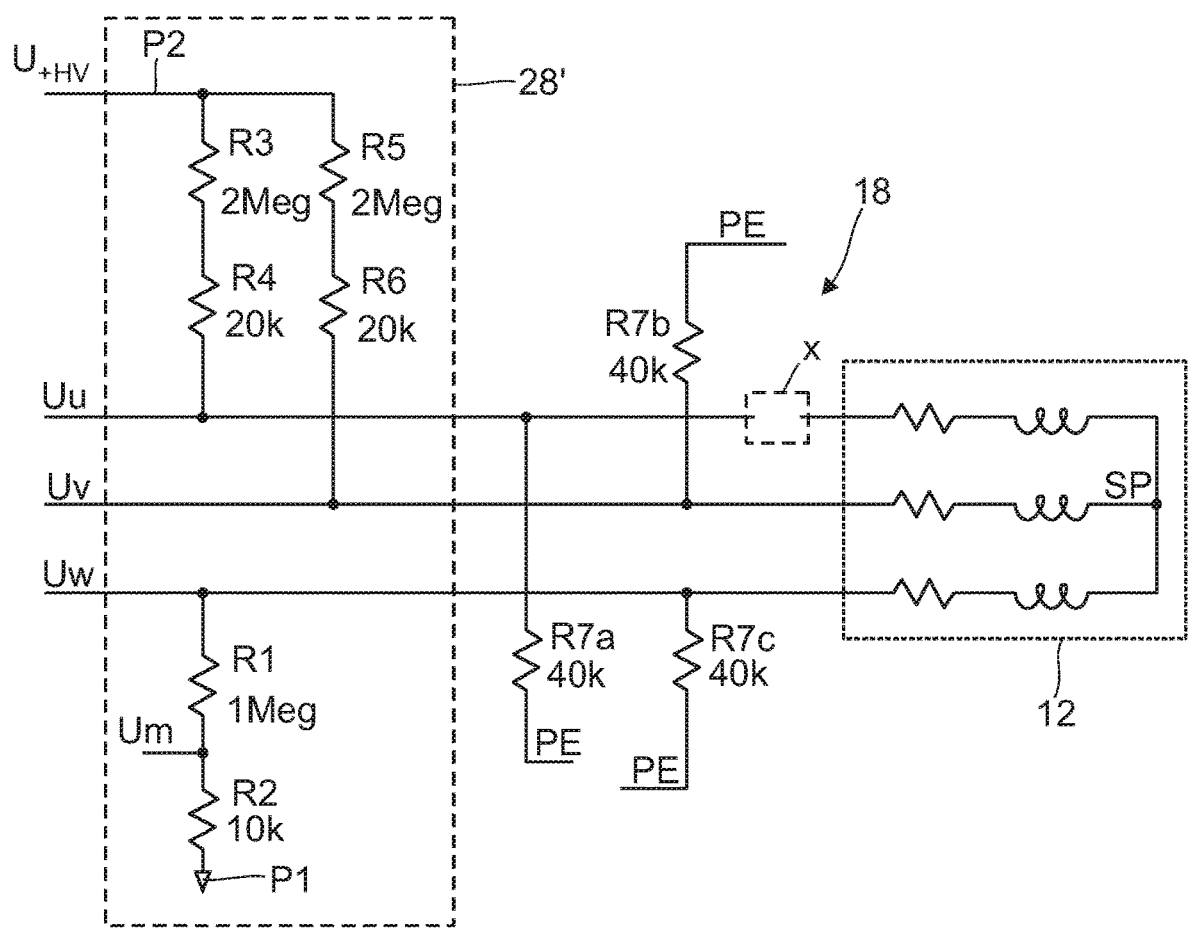
FIG. 13 is a circuit diagram of an embodiment variant of the detection circuit according to the present invention.

Referring to FIG. 13, an alternative embodiment of the detection circuit 28' is now explained in more detail, which detection circuit can be used, for example, instead of the above-described detection circuit 28 in combination with the drive circuits 10 from FIGS. 1, 4, 7 and 10 in order to also be able to detect the presence of an interruption X in a motor phase U, V, W in addition to the presence of an insulation fault R7a . . . d on a motor phase U, V, W. FIG. 13 shows, by way of example, the motor phase faults R7a, R7b, R7c and X which can be detected with the aid of this detection circuit 28'.

In a similar manner to the above embodiment variant of the detection circuit 28, the detection circuit 28' has a voltage divider comprising two first resistors R1 and R2, via which a first motor phase (here: W) is connected, in a high-impedance manner, to earth as the first reference potential P1 in order to capture and evaluate the corresponding motor phase voltage Uw as the measurement voltage Um of the voltage divider R1, R2. In contrast to the above embodiment variant of the detection circuit 28, however, this first motor phase W is also not connected to the positive pole of the DC voltage intermediate circuit 14. Instead, the other motor phases U and V are each connected, in a high-impedance manner, to the positive pole of the DC voltage intermediate circuit 14 as the second reference potential P2 via two further resistors R3, R4 and R5, R6, respectively. A divided motor phase voltage Uw is therefore captured as the measurement voltage Um via the voltage divider R1, R2.

If the drive circuit 10 is connected to single-phase or multi-phase power supply systems 26 and in the case of a total of three motor phases U, V, W, the sums of the resistance values R3+R4 and R5+R6 of the further resistors (for example approximately 2 megohms) are preferably twice as large as the sum of the resistance values R1+R2 of the first resistors (for example approximately 1 megohm), with the result that the measured motor phase voltage Um in the fault-free case again assumes half the intermediate circuit voltage, like in the preceding exemplary embodiments from FIGS. 1 to 12.

The detection of an insulation fault R7a . . . c on a motor phase U, V, W and the calculations of the insulation fault resistance R7, the fault current $I_{R7}$ during the fault check and the maximum possible fault current $I_{R7,max}$ during operation with the inverter 16 switched on are carried out in a similar manner to the fault checks described on the basis of FIGS. 1 to 12 using a detection circuit 28. However, if the detection circuit 28' from FIG. 13 is used, the motor phase voltage Uw also changes in the event of an interruption X in a motor phase since all motor phases U, V, W are then no longer connected to one another and the value of the measured motor phase voltage Um, even without an insulation fault R7a . . . c, does not assume half the intermediate circuit voltage $U_{+HV}/2$.

The following is a summary list of reference numerals and the corresponding structure used in the above description of the invention:
10 Drive circuit
12 Motor
14 DC voltage intermediate circuit
16 Inverter
18 Motor cable
20 Motor phase connection
22 Rectifier
24 AC connection
26 Supply network
28, 28' Detection circuit
30 Power factor correction filter (PFC filter)
C1, C2 Intermediate circuit capacitor of 14
D1, D2 Rectifier diodes of 22
D5 Rectifier diode of 30
D7-D12 Rectifier diodes of 22
L1, L2, L3 Phase conductor of 26
L8 Inductance of 30
M1-M6 power semiconductor switches of 16
M8 Switch of 30
N Neutral conductor of 26
PE Protective earthing
P1 First reference potential
P2 Second reference potential
R1, R2 First resistors of 28, 28'
R3, R4 Further resistors of 28'
R5, R6 Further resistors of 28'
R7 Insulation fault resistance
R7a . . . d Insulation fault resistances
R8, R9 Further resistors of 28
SP Neutral point of 12
U, V, W Motor phases of 12, 16, 18
X Interruption in a motor phase
$\Delta I$ Capacitor current
$I_{R7}$ Fault current
$U_{+HV}$ Intermediate circuit voltage
$U_{Lx}$ Voltage captured by 28, 28'
$U_{Netz}$ Network voltage
Uu,Uv,Uw Motor phase voltages

The invention claimed is:

1. A method for detecting a motor phase fault of a motor configuration, motor phases of the motor configuration being connected to a drive circuit having a DC voltage intermediate circuit and an inverter, wherein a first motor phase of the motor phases is connected to a first reference potential via at least one first resistor, and each other one of the motor phases is connected to a second reference potential via at least one further resistor, the method which comprises:
while the inverter is switched off, capturing a divided motor phase voltage of the first motor phase by a voltage divider;
using a voltage profile of the voltage measurement captured to determine whether there is the motor phase fault on one of the motor phases of the motor configuration; and
quantitatively calculating a fault current value of an insulation fault during a fault check and/or a resistance value of the insulation fault and/or a maximum possible fault current value of the insulation fault during operation with the inverter switched on based on the motor phase voltage captured.

2. The method according to claim 1, which further comprises calculating the fault current value of the insulation fault during a fault check and/or the resistance value of the insulation fault solely on a basis of resistance values of the at least one first resistor and the at least one further resistor, a measurement voltage of the divided motor phase voltage, as captured by the voltage divider, a network voltage of a supply network and an intermediate circuit voltage across the DC voltage intermediate circuit.

3. The method according to claim 1, which further comprises calculating a maximum possible fault current value of the insulation fault during operation with the inverter switched on solely on a basis of resistance values of the at least one first resistor and the at least one further resistor, a measurement voltage of the divided motor phase voltage, as captured by means of the voltage divider, a network voltage of a supply network and an intermediate circuit voltage across the DC voltage intermediate circuit.

4. A method for operating a drive circuit having a DC voltage intermediate circuit, a power factor correction filter and an inverter for driving an electronically commutated motor, which further comprises:
providing a motor configuration including motor phases connected to the inverter of the drive circuit, wherein the motor configuration includes the electronically commutated motor;
checking for a presence of a motor phase fault in the motor configuration by:
capturing a motor phase voltage from at least one of the motor phases with respect to a reference potential while the inverter is switched off; and
using a voltage profile of the motor phase voltage captured to determine whether there is the motor phase fault on one of the motor phases of the motor configuration; and
switching off the power factor correction filter when driving the electronically commutated motor after capturing the motor phase voltage if a maximum possible fault current value for an insulation fault on a motor phase below a predefined limit value has been determined.

5. A drive circuit for driving an electronically commutated motor, the drive circuit comprising:
a power correction filter;
a DC voltage intermediate circuit;
an inverter connected to said DC voltage intermediate circuit, wherein the inverter is connectable to motor phases of a motor configuration including the electronically commutated motor, and wherein at least one of the motor phases of the electronically commutated motor is connected via resistors to a first reference potential and a second reference potential;
a detection circuit for capturing a motor phase voltage from at least one of the motor phases with respect to a reference potential; and
a controller configured to operate said detection circuit for capturing the motor phase voltage while said inverter is switched off and to determine, on a basis of a voltage profile of the motor phase voltage captured, whether there is a motor phase fault on one of the motor phases of the motor configuration;
wherein said controller is configured to prevent switching-on of said inverter and/or of said power factor correction filter after capturing the motor phase voltage if the motor phase fault has been determined.

6. The drive circuit according to claim 5, wherein said detection circuit has at least one first resistor, via which at least one motor phase is connected to the first reference potential, and at least one further resistor, via which the at least one motor phase is connected to the second reference potential.

7. The drive circuit according to claim 5, wherein said detection circuit has at least one first resistor, via which a first motor phase of the motor phases is connected to the first reference potential, and at least one further resistor, via which another motor phase of the motor phases is respectively connected to the second reference potential.

8. The drive circuit according to claim 5, wherein said detection circuit has a voltage divider for capturing the motor phase voltage.

9. The drive circuit according to claim 5, wherein said detection circuit is configured to capture the motor phase voltage when the at least one of the motor phases is connected to the first reference potential and the at least one of the motor phases or at least one other one of the motor phases is connected to a second reference potential.

10. A method for detecting a motor phase fault of a motor configuration, motor phases of the motor configuration being connected to a drive circuit having a DC voltage intermediate circuit and an inverter, which comprises the steps of:
  connecting at least one motor phase to a plus pole of a DC-bus via at least one first resistor;
  connecting the at least one motor phase to a minus pole of the DC-bus via at least one further resistor;
  capturing a divided motor phase voltage from at least one of the motor phases with respect to a reference potential while the inverter is switched off; and
  using a voltage profile of the motor phase voltage captured to determine whether there is the motor phase fault on one of the motor phases of the motor configuration.

* * * * *